United States Patent [19]

Matsuoka

[11] Patent Number: 5,295,840
[45] Date of Patent: Mar. 22, 1994

[54] CONTACT HAVING SPRING PORTION WITH SMALLER THICKNESS CONTACTING SURFACE

[75] Inventor: Noriyuki Matsuoka, Yokohama, Japan

[73] Assignee: Yamaichi Electronics Co., Ltd., Tokyo, Japan

[21] Appl. No.: 974,500

[22] Filed: Nov. 12, 1992

[30] Foreign Application Priority Data

Dec. 13, 1991 [JP] Japan .................. 3-352175

[51] Int. Cl.⁵ .................. H01R 9/09; H01R 13/24
[52] U.S. Cl. .................. 439/72; 439/886; 29/876
[58] Field of Search .................. 29/874, 876, 877, 881, 29/884, 885; 439/70, 71, 72, 73, 886, 86, 630, 418

[56] References Cited

U.S. PATENT DOCUMENTS

| | | | |
|---|---|---|---|
| 4,593,463 | 6/1986 | Kamono et al. | 29/884 |
| 4,665,614 | 5/1987 | Stipanuk et al. | 29/884 |
| 4,780,093 | 10/1988 | Walse et al. | 439/418 |
| 4,846,704 | 7/1989 | Ikeya | 439/72 |
| 4,921,430 | 5/1990 | Matsuoka | 439/886 X |
| 4,927,368 | 5/1990 | Shino | 439/86 X |

FOREIGN PATENT DOCUMENTS 64-3977 1/1989 Japan.
2-94374 4/1990 Japan.

*Primary Examiner*—Peter Dungba Vo
*Attorney, Agent, or Firm*—Wenderoth, Lind & Ponack

[57] ABSTRACT

An insulating layer is formed on at least one side surface of a spring portion of a contact, and a contacting portion formed on the spring portion is made narrower than the thickness of the spring portion, and a contacting surface of the contacting portion spaced from an edge portion of the insulating layer inwardly of the side surfaces of the spring portion.

4 Claims, 2 Drawing Sheets

CONTACT HAVING SPRING PORTION WITH SMALLER THICKNESS CONTACTING SURFACE

BACKGROUND OF THE INVENTION

1. Field of the Invention

This invention relates to a contact for elastically contacting an electric part terminal, and particularly to a contact suitable to be contacted with an IC package, etc. at micro pitches.

2. Brief Description of the Prior Art

In Japanese Patent Early Laid-Open Publication No. Sho 64-3977, an insulating film is applied to a side surface of a contact on which an IC lead is placed for contact, and the contact is implanted into a substrate with this insulating film intimately engaged with to an adjacent contact in order to electrically isolate the adjacent contacts, thereby making contact pitches smaller.

In the case where the insulating film is interposed between adjacent contacts in order to intimately engage to an adjacent contact in accordance with the prior art, the arrangement is very effective for making each contact pitch smaller. However, since the adjacent contacts are very close to each other separated only by a thin film, terminals of an electric part and contacting portions of contacts cannot not be placed in correct correspondence, one by one, with each other when positioning of the electric part is not exact with respect to a connector having contacts. As a result, it gives rise to the problem that, for example, a terminal contacts two adjacent contacting portions on opposite sides of the insulating film and therefore, the adjacent terminals are short-circuited.

SUMMARY OF THE INVENTION

It is therefore an object of the present invention to provide a contact in which the above-described problems inherent in the prior art can be properly solved and its features can be effectively utilized.

In order to achieve the above object, there is essentially provided a contact comprising a spring portion provided with a contacting portion, a contacting force of said contacting portion against an electric part terminal being obtained by elasticity of said spring portion, said contact further comprising an insulating layer formed on a side surface of said spring portion, said contacting portion being narrower than a thickness dimension between left and right side surfaces of said spring portion, a contacting surface of said contacting portion being spaced from said insulating layer edge portion inwardly from the side surfaces of said spring portion.

As described above, the contacts arranged in adjacent relation with each other are mutually electrically isolated by the thickness of the insulating layer, and the contacting portion is narrower than the thickness of the spring portion, and the terminal contacting surface of the contacting portion is spaced from the edge portion of the insulating layer inwardly from the side surfaces of the spring portion. Accordingly, a space between the adjacent contacting portions can be obtained which is greater than the thickness of the insulating layer. Moreover, even in the case where positioning of the electric part with respect to the connector is not exact, there can be effectively solved such problems that the contacting portions of the adjacent contacts are short-circuited by the electric part terminal. As a result, there can be effectively achieved both the object of electrically isolating the adjacent contacts by the insulating layer applied to a side surface of the spring portion and the object of making the contact pitches smaller.

DETAILED DESCRIPTION OF THE EMBODIMENTS

Embodiments of the present invention will now be described in detail with reference to FIGS. 1 through 5 inclusive.

Figure 3:
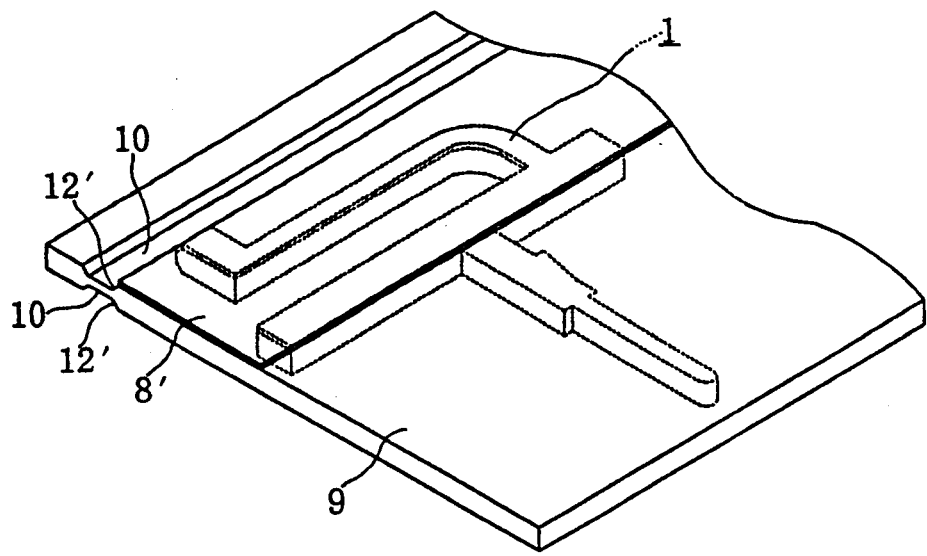
FIG. 3 is a perspective view of a strip material schematically showing a punching process for making the contact.

The present invention is applied to a contact of the type as shown in Japanese Patent Early Laid-Open Publication No. Sho 64-3977, in which an electric part terminal is placed on and press contacted with a contacting portion, or to a contact of the type as shown in Japanese Patent Early Laid-Open Publication No. Hei 2-94374 in which the contact is brought into contact with a side surface or an upper surface of an electric part terminal. FIG. 3 of Japanese Early Laid-Open Publication No. Sho64-3977 is a representative example of the former contact 1.

Figure 1:
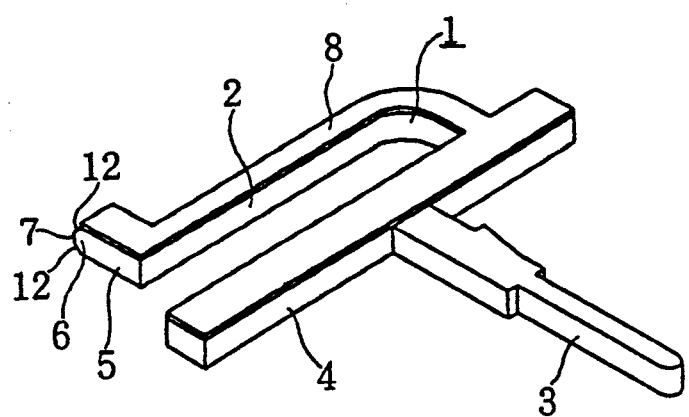
FIG. 1 is a perspective view showing a contact according to one embodiment of the present invention.
Figure 4:
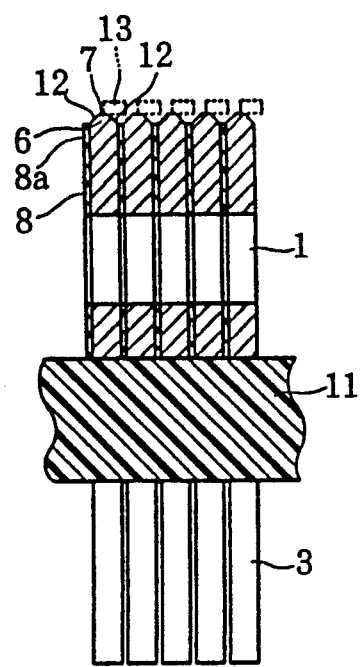
FIG. 4 is a sectional view of the contact group of FIG. 2 implanted in an insulating substrate forming a connector body.
Figure 5:
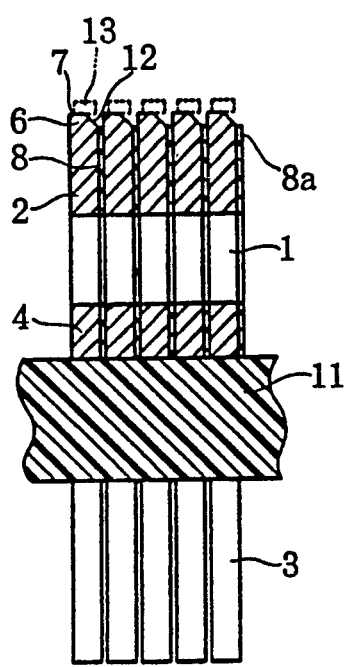
FIG. 5 is a sectional view, similar to FIG. 4, showing a contact according to another embodiment of the present invention.

The contact 1 of the present invention as shown in FIG. 1 comprises a spring portion 2 disposed at an upper portion, a male terminal portion 3 disposed at a lower portion, and a seat element 4 disposed at an area of connection between the spring portion 2 and the male terminal portion 3. The seat element 4 extending in a lateral direction stably supports the contact 1 when it is set on a substrate forming a connector body. The spring portion 2 extending from one end of the seat element 4 to the other end thereof is provided at a free front end thereof with a projecting portion 5 facing upward. As shown in FIGS. 4 and 5, the projecting portion 5 has a contacting portion 6 (as will be described) formed at an upper end thereof and adapted to contact with a terminal 13 of an electric part placed thereon. The numeral 7 denotes a contacting surface which is formed on an outer free end surface of the contacting portion 6, and on which the terminal 13 of an electric part is placed.

A plurality of the contacts 1, as shown in FIGS. 4 and 5, are arranged side by side by inserting the male terminal portions 3 into a substrate 11, and the male terminal portions 3 projecting downward from the substrate 11 are inserted for connection into connection holes formed in a circuit board (not shown).

An insulating layer 8 is applied to a side surface of the contact 1, i.e., to at least one side surface of the spring portion 2. The insulating layer 8 is formed by adhesion of an insulating film, or coating, burning or bonding of an insulating material. For example, as shown in FIG. 3, an insulating film 8 is adhered to, or an insulating material 8 is integrally applied by means of coating, burning, molding, bonding, etc. to one side surface of a metal strip material 9 from which the contact 1 is punched out.

Figure 2:
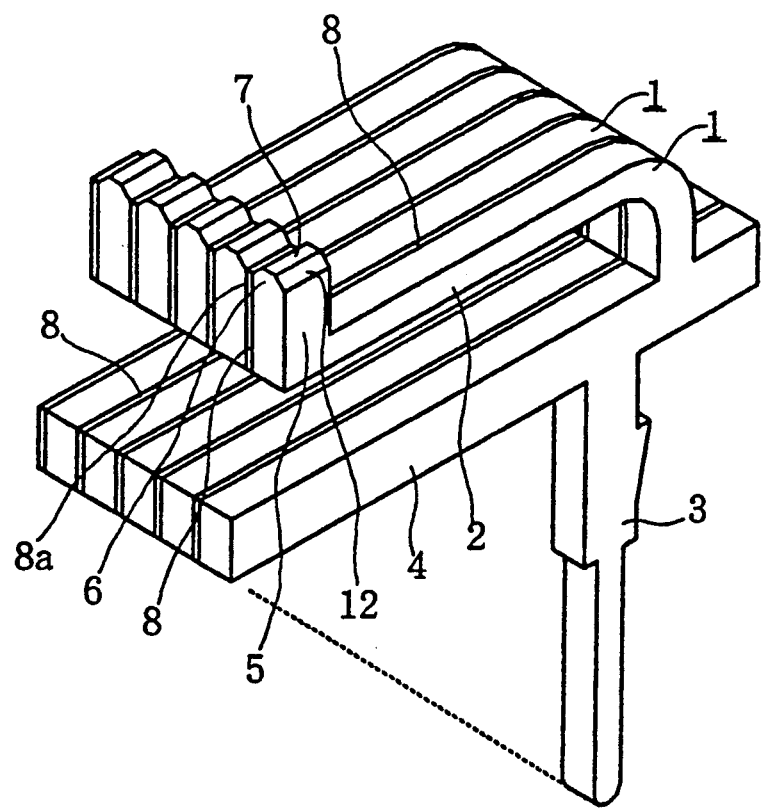
FIG. 2 is a perspective view showing a plurality of the contacts of FIG. 1 arranged side by side in intimately engaged relation with each other.

From this strip material 9, the contact 1 is punched out, with the insulating layer 8 formed on one side surface thereof. At this time, the insulating layer 8 is on a side surface of the contact 1 other than the male terminal portion 3, i.e., at least one side surface of the spring portion 2. As shown in FIG. 2, the contacts 2 are implanted into the substrate 11 with the insulating layers 8 intimately engaged with adjacent contacts.

In each contact thus implanted, the thickness of the contacting portion 6 is less than the thickness between the left and right side surfaces of the spring portion 2, and the contacting surface 7 of this contacting portion 6 is spaced from an the portion of the insulating layer 8 inwardly from the side surfaces of the spring portion 2. Preferably, at least one side surface of the contacting portion 6, i.e., the contacting portion side surface where the insulating layer 8 is applied, is provided with an inclined surface 12 for reducing the thickness, and the contacting surface 7 is exposed inwardly of the edge portion of the insulating layer 8.

In the embodiment shown in FIGS. 1 through 4 inclusive, the projecting portion 5 is provided on left and right side surfaces of its upper end with the inclined surfaces 12, respectively. This contacting portion 6 is formed in a generally trapezoidal cross-sectional shape. The contacting portion 6 and the contacting surface 7 are in symmetric relation with respect to a plane through the center of the thickness of the spring portion 2. The contacting surface 7 is spaced from the edge portion 8a of the insulating layer 8 inwardly from the edge portion 8a of the insulating layer 8 and the left and right side surfaces of the spring portion 2.

In the embodiment of FIG. 5, the inclined surface 12 is formed on one side surface of the upper end of the projecting portion 5, preferably the side where the insulating layer 8 is applied, and the contacting surface 7 is spaced from the edge portion of the insulating layer 8 inwardly from the edge portion 8a of the insulating layer 8 and one side surface of the spring portion 2.

As means for forming the contacting portion 6, as shown in FIG. 3, a groove 10 is formed in at least one side surface of the strip material 9 to which the insulating layer 8' is applied over the entire length of the strip material 9, and the inclined surfaces 12' are formed by the inner surfaces of the groove 10 beforehand respectively. By punching out the contact 1 such that the contacting portion 6 is situated at a location where the inclined surfaces 12' are formed, the contacting portion 6 can be made narrow.

For forming the contacting portion 6 shown in FIGS. 1 through 4 inclusive, as shown in FIG. 3, the grooves 10 are formed in both sides of the strip material 9 respectively, and the contact 1 is punched out, so that the contacting surface 7 of the contacting portion 6 is spaced from the edge portion of the insulating layer 8 inwardly from the left and right side surfaces of the spring portion 2. Similarly, for forming the contacting portion 6 shown in FIG. 5, the groove 10 is formed only in the surface side of the strip material 9 to which the insulating layer 8' is applied, and the contact 1 is punched out such that the contacting surface 7 of the contacting portion 6 is spaced from the edge portion 8a of the insulating layer 8 inwardly from the one side surface of the spring portion 2.

Figure 6:
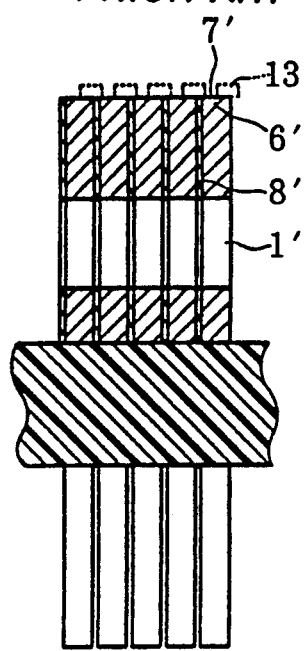
FIG. 6 is a sectional view, similar to FIG. 4, showing a conventional contact.

The terminal 13 of an electric part is contacted with the contacting portion of the spring portion. In the prior art, as shown in FIG. 6, the terminal 13 may, if is not precisely positioned, be contacted with contacting surfaces 7' of the adjacent contacting portions 6' because the insulating film 8' is very thin, and as a result, the contacts 1 and the terminals 13 are short-circuited respectively. However, according to the present invention, even if positioning of the electric part with respect to the connector is not precise, as shown in FIGS. 4 and 5, the electric part terminal 13 is not contacted with the contacting surfaces 7 of the adjacent contacting portions 6, and as a result, the terminals and contacts are not short-circuited respectively, and the contacts and the terminals can be placed in one by one corresponding relation with each other. As a result, the contacts can be electrically isolated by the insulating layer 8, and small pitches can be obtained.

According to the present invention, the contacts are favorably isolated from each other by the thickness of the insulating layer, and a space between the adjacent contacting portions is obtained irrespective of the thickness of the insulating layer. As a result, short-circuiting between the adjacent terminals and between the adjacent contacts can be properly prevented. As a result, the adjacent contacts can be electrically isolated by the insulating layer applied to the side surface of the spring portion of the contracts, and contact pitches can be made small effectively. Owing to the foregoing features, the contact of the present invention can properly cope with the recent tendency for arranging IC leads at micro pitches.

What is claimed is:

1. A contact comprising:
    a spring portion having opposite side surfaces spaced at a spring portion thickness and an edge surface between said opposite side surfaces extending in said spring portion thickness direction;
    a contacting portion projecting from said edge surface and having a contacting surface on an outer free end for being contacted by a terminal of an electric part, said terminal of said electric part moving said spring portion against the resilience thereof for producing a contacting force of said contacting portion against the electric part terminal; and
    an insulating layer on at least one surface of said spring portion and having a thickness substantially less than the spring portion thickness of said spring portion and an insulation layer edge portion along a side of said edge surface of said spring portion;
    said contacting portion having a smaller thickness than said thickness between said opposite side surfaces of said spring portion and having said contacting surface spaced from said insulating layer edge portion and inwardly from said at least one side surface of said spring portion.

2. The contact as claimed in claim 1 in which said contacting portion has a side surface inclined inwardly from said at least one side surface of said spring portion to said contacting surface.

3. The contact as claimed in claim 1 in which said contacting portion has opposite side surfaces inclined inwardly from respective opposite side surfaces of said spring portion.

4. A contact structure comprising a plurality of side by side contacts, each contact having:
- a spring portion having opposite side surfaces spaced at a spring portion thickness and an edge surface between said opposite side surfaces extending in said spring portion thickness direction;
- a contacting portion projecting from said edge surface and having a contacting surface on an outer free end for being contacted by a terminal of an electric part, said terminal of said electric part moving said spring portion against the resilience thereof for producing a contacting force of said contacting portion against the electric part terminal; and
- an insulating layer on at least one surface of said spring portion and having a thickness substantially less than the spring portion thickness of said spring portion and an insulation layer edge portion along a side of said edge surface of said spring portion;
- said contacting portion having a smaller thickness than said thickness between said opposite side surfaces of said spring portion and having said contacting surface spaced from said insulating layer edge portion and inwardly from said at least one side surface of said spring portion;
- said contacts each having said insulating layer thereon abutting a next adjacent contact for providing an insulating layer between each two adjacent contacts.

* * * * *